US009684213B2

(12) United States Patent
Wu (10) Patent No.: US 9,684,213 B2
(45) Date of Patent: Jun. 20, 2017

(54) BOA LIQUID CRYSTAL PANEL AND MANUFACTURING METHOD THEREOF (71) Applicant: Shenzhen China Star Optoelectronics Technology Co., Ltd., Shenzhen, Guangdong (CN)

(72) Inventor: Chuan Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 273 days.

(21) Appl. No.: 14/423,128

(22) PCT Filed: Feb. 6, 2015

(86) PCT No.: PCT/CN2015/072377
§ 371 (c)(1),
(2) Date: Feb. 21, 2015

(87) PCT Pub. No.: WO2016/074353
PCT Pub. Date: May 19, 2016

(65) Prior Publication Data
US 2016/0342046 A1 Nov. 24, 2016

(30) Foreign Application Priority Data

Nov. 13, 2014 (CN) .......................... 2014 1 0642135

(51) Int. Cl.
*G02F 1/1362* (2006.01)
*G02F 1/1339* (2006.01)
(Continued)

(52) U.S. Cl.
CPC ...... *G02F 1/136209* (2013.01); *G02F 1/1341* (2013.01); *G02F 1/1368* (2013.01);
(Continued)

(58) Field of Classification Search
CPC ........... G02F 1/13394; G02F 1/136209; H01L 29/78669; H01L 29/78678; H01L 27/1222; H01L 27/124; H01L 27/127
See application file for complete search history.

(56) References Cited

U.S. PATENT DOCUMENTS 5,760,861 A * 6/1998 Kim .................. G02F 1/136209
349/110
2002/0075443 A1* 6/2002 Shimizu .............. G02F 1/13394
349/155
(Continued)

FOREIGN PATENT DOCUMENTS

CN 1834740 A 9/2006

*Primary Examiner* — Ryan Crockett
(74) *Attorney, Agent, or Firm* — Andrew C. Cheng (57) ABSTRACT The present invention provides a BOA liquid crystal panel and a manufacturing method thereof. The BOA liquid crystal panel includes a first substrate, a second substrate opposite to the first substrate, a black matrix arranged in the first substrate, a thin-film transistor arranged on the black matrix, a color resist layer arranged on the second substrate, a common electrode layer arranged on the second substrate and the color resist layer, a photoresist spacer arranged on the common electrode layer and located between the first substrate and the second substrate, and a liquid crystal layer arranged between the first substrate and the second substrate. The present invention arranges the black matrix of the liquid crystal panel in a channel that is pre-formed in a substrate to make the film thickness of the liquid crystal panel uniform and improve the display performance of the liquid crystal panel.

12 Claims, 6 Drawing Sheets (51) Int. Cl.
*G02F 1/1341* (2006.01)
*G02F 1/1343* (2006.01)
*G02F 1/1368* (2006.01)
*H01L 27/12* (2006.01)
*H01L 29/768* (2006.01)
*H01L 29/786* (2006.01)
*G02F 1/1333* (2006.01)

(52) U.S. Cl.
CPC ...... G02F 1/13394 (2013.01); G02F 1/13439 (2013.01); G02F 1/134309 (2013.01); H01L 27/124 (2013.01); H01L 27/127 (2013.01); H01L 27/1222 (2013.01); H01L 29/78669 (2013.01); H01L 29/78678 (2013.01); *G02F 2001/13398* (2013.01); *G02F 2001/133302* (2013.01); *G02F 2201/121* (2013.01); *G02F 2202/103* (2013.01); *G02F 2202/104* (2013.01)

(56) References Cited

U.S. PATENT DOCUMENTS

2002/0139980 A1* 10/2002 Yamazaki ............. G02F 1/1368
 257/72
2006/0209222 A1* 9/2006 Yasuda ............. G02F 1/136209
 349/43
2011/0241006 A1* 10/2011 Mitani ............. G02F 1/136209
 257/59

\* cited by examiner

BOA LIQUID CRYSTAL PANEL AND MANUFACTURING METHOD THEREOF

BACKGROUND OF THE INVENTION

1. Field of the Invention

The present invention relates to the field of displaying technology, and in particular to a BOA (Black Matrix On Array) and a manufacturing method thereof.

2. The Related Arts

Liquid crystal displays (LCDs) have a variety of advantages, such as thin device body, low power consumption, and being free of radiation, and are thus of wide applications, such as mobile phones, personal digital assistants (PDAs), digital cameras, computer monitors, and notebook computer screens.

Most of the liquid crystal displays that are currently available in the market are backlighting liquid crystal displays, which comprise a backlight module and a liquid crystal panel mounted to the backlight module.

In a thin-film transistor liquid crystal display (TFT-LCD), it is often to provide a layer of black matrix (BM) on a substrate to separate adjacent color resists, shield gaps between colors, and prevent light leakage or color mixture. The technique that forms the black matrix on a TFT array substrate is referred to as BOA. BOA can be used to overcome problems caused by mismatch of light shield zones due to positional shift of upper and lower substrates. This is particularly useful in curved display devices.

Figure 1:
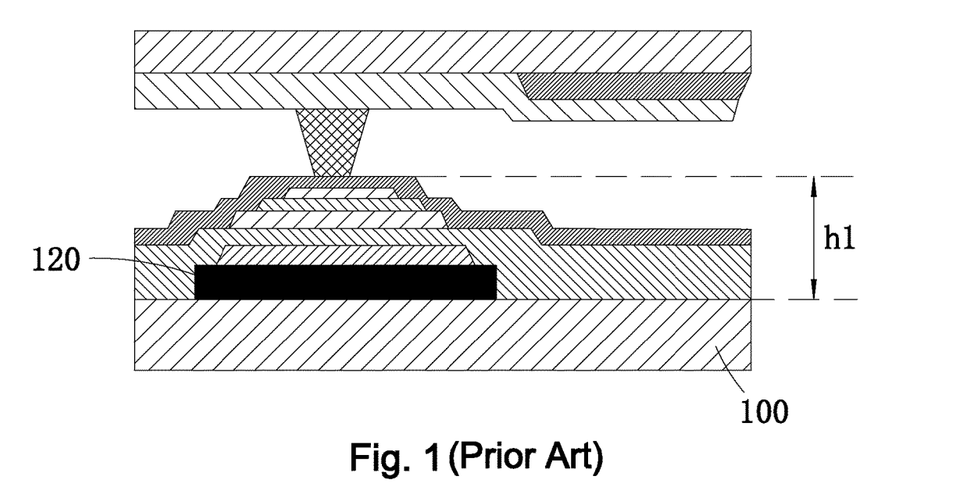
FIG. 1 is a cross-sectional view showing a conventional BOA (Black Matrix on Array) liquid crystal panel.
Figure 2:
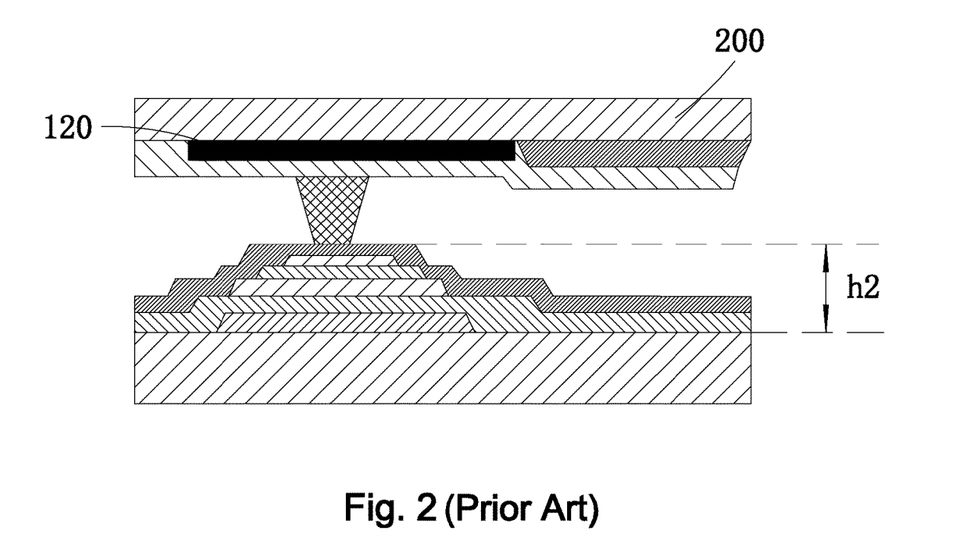
FIG. 2 is a cross-sectional view showing a non-BOA liquid crystal panel.

As shown in FIG. 1, in a manufacturing process of a conventional BOA liquid crystal panel, a layer of black matrix 120 is directly formed on an array substrate 100. This increases the film thickness h1 of the BM area of the array substrate 100. FIG. 2 shows a non-BOA structure (which is a black matrix on color filter (BM on CF) structure), meaning the black matrix 120 is formed on a CF substrate 200. It can be seen that the film thickness h1 of the BOA liquid crystal panel shown in FIG. 1 is greater than the film thickness h2 of the non-BOA liquid crystal panel shown in FIG. 2. Thus, for the BOA liquid crystal panel, since the site where black matrix is formed on the TFT substrate has an increased film thickness, a film thickness difference between the BM area and the non-BM area is made larger and a draft angle of the film between the BM and non-BM areas becomes steeper. In the subsequent metal process, a potential risk of line breaking due to an excessively large draft angle may occur, leading to defects. If an additional planarization layer is included, then additional operations may be needed, leading to other problems.

SUMMARY OF THE INVENTION

An object of the present invention is to provide a BOA liquid crystal panel, which comprises a black matrix that is arranged in a channel that is pre-formed in a substrate so as to make the film thickness of the liquid crystal panel uniform to better the display performance.

Another object of the present invention is to provide a manufacturing method of a BOA liquid crystal panel, which forms a channel in a substrate before a TFT process and forms a black matrix in the channel so as to make the film thickness of the liquid crystal panel uniform and better the display performance of a display device.

To achieve the above object, the present invention provides a BOA liquid crystal panel, which comprises a first substrate, a second substrate opposite to the first substrate, a black matrix arranged in the first substrate, a thin-film transistor arranged on the black matrix, a color resist layer arranged on the second substrate, a common electrode layer arranged on the second substrate and the color resist layer, a photoresist spacer arranged on the common electrode layer and located between the first substrate and the second substrate, and a liquid crystal layer arranged between the first substrate and the second substrate. The first substrate comprises a channel formed therein and the black matrix is arranged in the channel so that a surface of the first substrate is substantially flush with a surface of the black matrix.

The first substrate and the second substrate are glass substrates.

The first substrate is a TFT substrate and the second substrate is a CF substrate.

The thin-film transistor comprises a first metal layer arranged on the first substrate, a gate insulation layer arranged on the first metal layer and covering the first substrate, a semiconductor layer arranged on the gate insulation layer, a second metal layer arranged on the semiconductor layer, and an insulation protection layer arranged on the second metal layer and covering the first substrate.

The gate insulation layer comprises a material of silicon nitride.

The semiconductor layer comprises a material of polysilicon or amorphous silicon.

The present invention also provides a manufacturing method of a BOA liquid crystal panel, which comprises the following steps:

(1) providing a first substrate and a second substrate and washing the first substrate and the second substrate;

(2) forming a channel in the first substrate;

(3) forming a black matrix in the channel;

(4) forming a thin-film transistor on the black matrix;

(5) forming a color resist layer on the second substrate, forming a common electrode layer on the second substrate and the color resist layer, and forming a photoresist spacer on the common electrode layer; and (6) filling liquid crystal molecules between the first substrate and the second substrate to form a liquid crystal layer and packaging the first substrate and the second substrate.

In step (1), the first substrate and the second substrate are glass substrates.

In step (2), the channel is formed in the first substrate through photolithography or etching.

Step (4) comprises steps of sequentially forming a first metal layer, a gate insulation layer, a semiconductor layer, a second metal layer, and an insulation protection layer on the first substrate.

The efficacy of the present invention is that the present invention provides a BOA liquid crystal panel, which comprises a black matrix of the liquid crystal panel arranged in a channel that is pre-formed in a substrate so as to make the film thickness of the liquid crystal panel uniform and better the display performance. The present invention provides a manufacturing method of a BOA liquid crystal panel, which forms a channel in a substrate before a TFT process and forming a black matrix in the channel so as to make the film thickness of the liquid crystal panel uniform and better the display performance of a display device.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
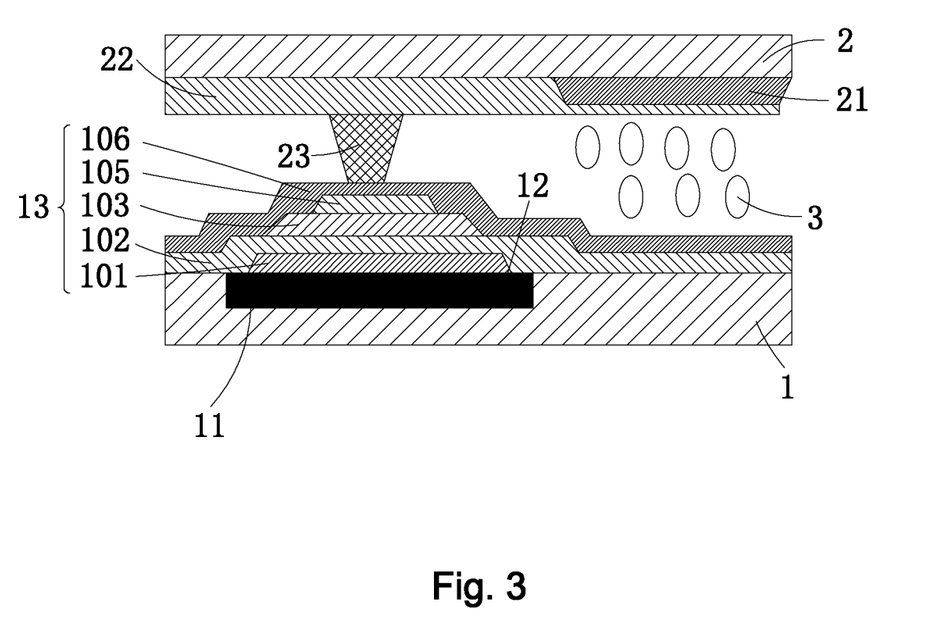
FIG. 3 is a cross-sectional view showing a BOA liquid crystal panel according to the present invention.

Referring to FIG. 3, the present invention provides a BOA (Black Matrix on Array) liquid crystal panel, which comprises a first substrate 1, a second substrate 2 opposite to the first substrate 1, a black matrix 12 arranged in the first substrate 1, a thin-film transistor 13 arranged on the black matrix 12, a color resist layer 21 arranged on the second substrate 2, a common electrode layer 22 arranged on the second substrate 2 and the color resist layer 21, a photoresist spacer 23 arranged on the common electrode layer 22 and located between the first substrate 1 and the second substrate 2, and a liquid crystal layer 3 arranged between the first substrate 1 and the second substrate 2. The first substrate 1 comprises a channel 11 formed therein and the black matrix 12 is arranged in the channel 11 in such a way that a surface of the first substrate 1 is substantially flush with a surface of the black matrix 12.

Preferably, the first substrate 1 and the second substrate 2 are glass substrates; the first substrate 1 is a thin-film transistor (TFT) substrate; and the second substrate 2 is a color filter (CF) substrate. Specifically, the thin-film transistor 13 comprises a first metal layer 101 arranged on the first substrate 1, a gate insulation layer 102 arranged on the first metal layer 101 and covering the first substrate 1, a semiconductor layer 103 arranged on the gate insulation layer 102, a second metal layer 105 arranged on the semiconductor layer 103, and an insulation protection layer 106 arranged on the second metal layer 105 and covering the first substrate 1.

Specifically, the first metal layer 101 serves as a gate of the thin-film transistor 13 and the second metal layer 105 serves as a source or a drain of the thin-film transistor 13.

Preferably, the gate insulation layer 102 comprises a material of silicon nitride (SiNx).

Preferably, the semiconductor layer 103 comprises a material of poly-silicon or amorphous silicon.

Figure 4:
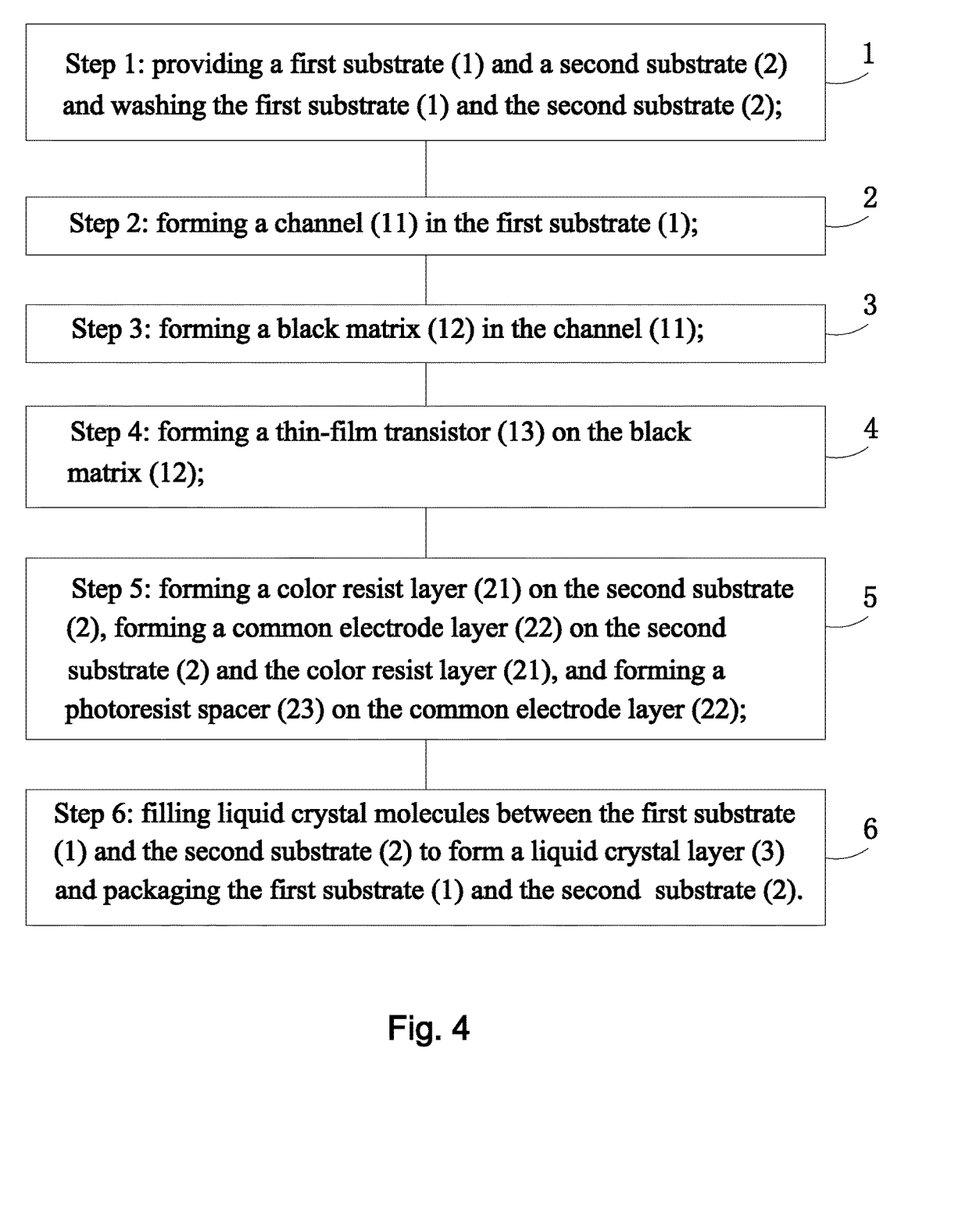
FIG. 4 is a flow chart illustrating a manufacturing method of a BOA liquid crystal panel according to the present invention.

Referring to FIG. 4, the present invention also provides a manufacturing method of a BOA liquid crystal panel, which comprises the following steps:

Step 1: providing a first substrate 1 and a second substrate 2 and washing the first substrate 1 and the second substrate 2.

Preferably, the first substrate 1 and the second substrate 2 are glass substrates; the first substrate 1 is a TFT substrate; and the second substrate 2 is a CF substrate.

Figure 5:
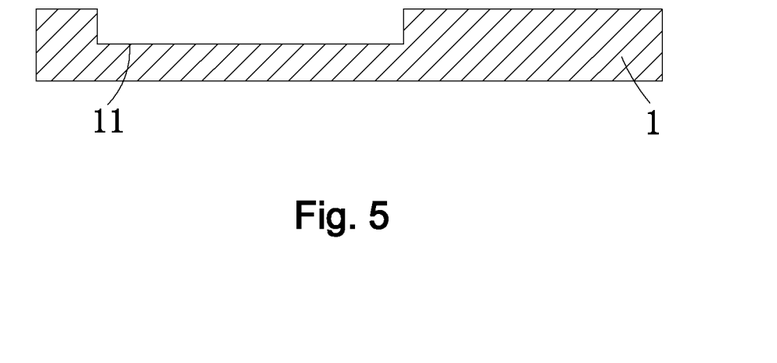
FIG. 5 is a cross-sectional view illustrating step (2) of the manufacturing method of the BOA liquid crystal panel according to the present invention.
Figure 6:
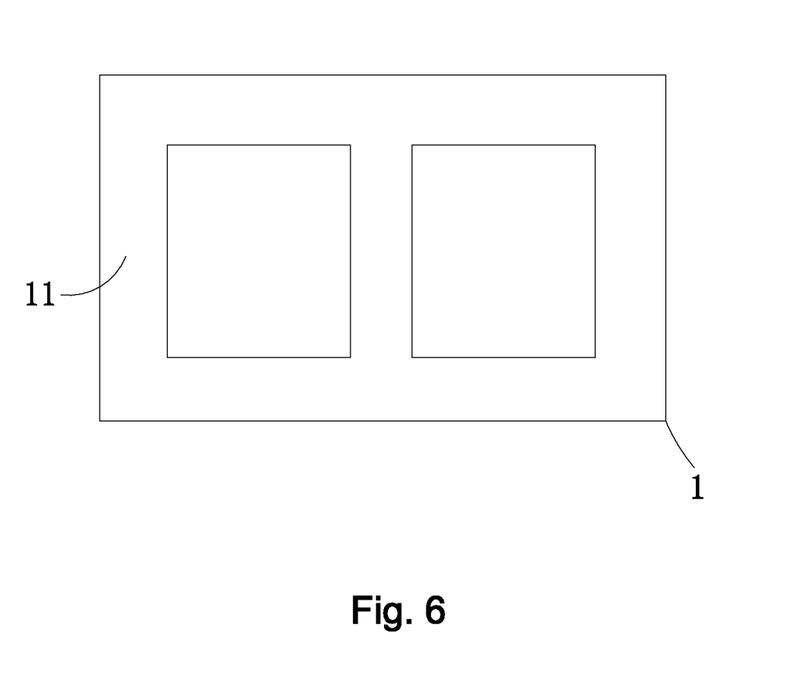
FIG. 6 is a top plan view illustrating step (2) of the manufacturing method of the BOA liquid crystal panel according to the present invention.

Step 2: as shown in FIGS. 5 and 6, forming a channel 11 in the first substrate 1.

Specifically, the channel 11 is formed in the first substrate 1 through photolithography or etching according to a shape of a black matrix to be formed. FIG. 6 provides a partial top plan view illustrating the formation of the channel 11 in the first substrate 1.

Figure 7:
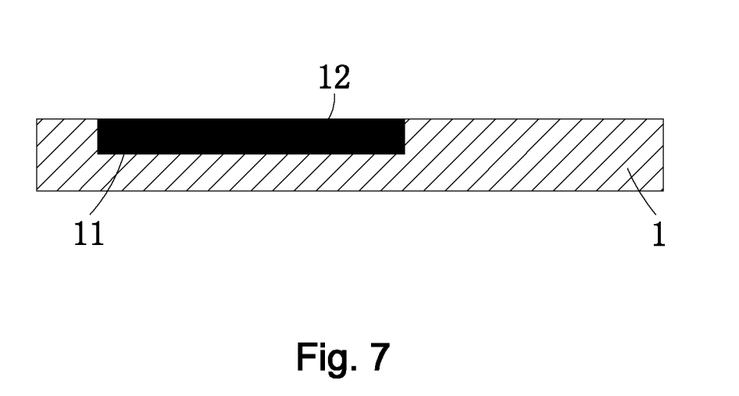
FIG. 7 is a cross-sectional view illustrating step (3) of the manufacturing method of the BOA liquid crystal panel according to the present invention.
Figure 8:
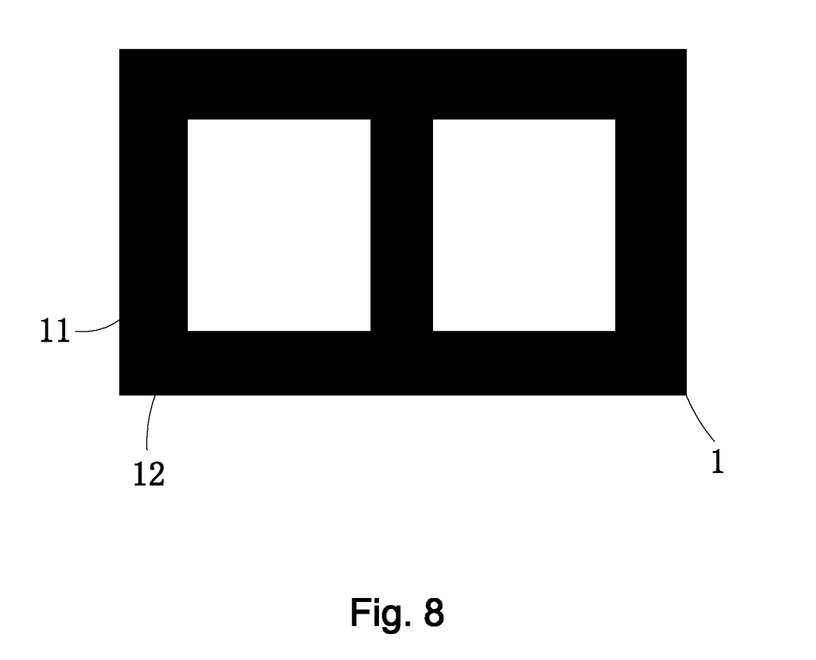
FIG. 8 is a top plan view illustrating step (3) of the manufacturing method of the BOA liquid crystal panel according to the present invention.

Step 3: as shown in FIGS. 7 and 8, forming a black matrix 12 in the channel 11.

Specifically, an amount of a black matrix material that is necessary for filling is calculated according to the depth and width of the channel 11 so that the back matrix material so filled exactly fills up the channel 1. FIG. 8 provides a partial top plan view illustrating the channel 11 that is filled with the back matrix material.

Figure 9:
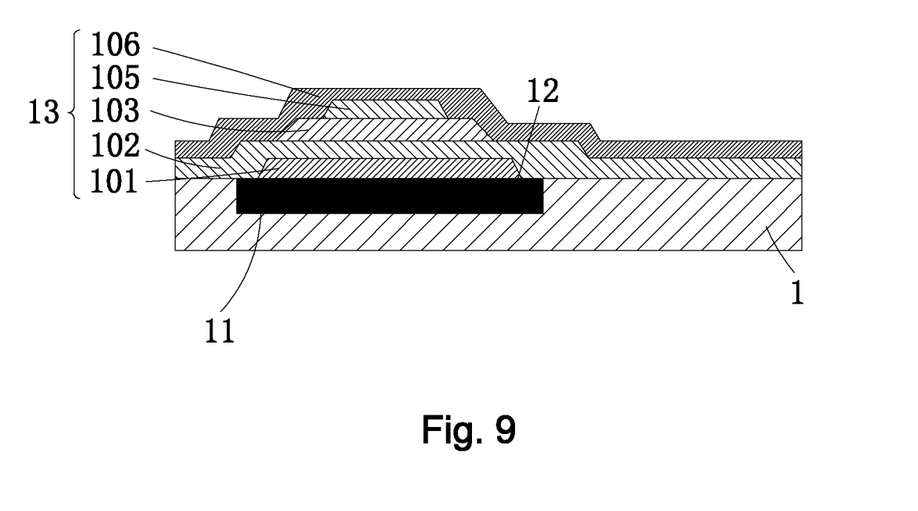
FIG. 9 is a cross-sectional view illustrating step (4) of the manufacturing method of the BOA liquid crystal panel according to the present invention.

Step 4: as shown in FIG. 9, forming a thin-film transistor 13 on the black matrix 12.

Specifically, a first metal layer 101, a gate insulation layer 102, a semiconductor layer 103, a second metal layer 105, and an insulation protection layer 106 are sequentially formed on the first substrate 1. The first metal layer 101 serves as a gate of the thin-film transistor 13 and the second metal layer 105 serves as a source or a drain of the thin-film transistor 13.

Figure 10:
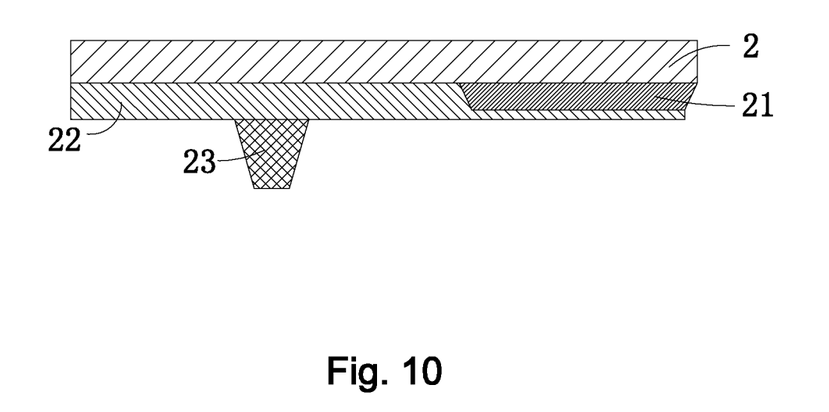
FIG. 10 is a cross-sectional view illustrating step (5) of the manufacturing method of the BOA liquid crystal panel according to the present invention.

Step 5: as shown in FIG. 10, forming a color resist layer 21 on the second substrate 2, forming a common electrode layer 22 on the second substrate 2 and the color resist layer 21, and forming a photoresist spacer 23 on the common electrode layer 22. The photoresist spacer 23 provides a function of supporting the first substrate 1 and the second substrate 2 to maintain the thickness of a liquid crystal layer.

Step 6: filling liquid crystal molecules between the first substrate 1 and the second substrate 2 to form a liquid crystal layer 3 and packaging the first substrate 1 and the second substrate 2.

Specifically, a UV (ultraviolet) curable resin is applied between the first substrate 1 and the second substrate 2 and laminating the first substrate 1 and the second substrate 2 together in a vacuum environment. The UV curable resin is cured by application of irradiation of UV or heating to complete packaging of the liquid crystal panel. A cross-sectional view of the completed liquid crystal panel is illustrated in FIG. 3.

In summary, the present invention provides a BOA liquid crystal panel, which comprises a black matrix of the liquid crystal panel arranged in a channel that is pre-formed in a substrate so as to make the film thickness of the liquid crystal panel uniform and better the display performance. The present invention provides a manufacturing method of a BOA liquid crystal panel, which forms a channel in a substrate before a TFT process and forming a black matrix in the channel so as to make the film thickness of the liquid crystal panel uniform and better the display performance of a display device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A black-matrix-on-array (BOA) liquid crystal panel, comprising a first substrate, a second substrate opposite to the first substrate, a black matrix arranged in the first substrate, a thin-film transistor arranged on the black matrix, a color resist layer arranged on the second substrate, a common electrode layer arranged on the second substrate and the color resist layer, a photoresist spacer arranged on the common electrode layer and located between the first substrate and the second substrate, and a liquid crystal layer arranged between the first substrate and the second substrate, the first substrate comprising a channel formed therein, the black matrix being formed of a light-shielding material arranged in the channel so that a surface of the first substrate is substantially flush with a top surface of the black matrix and the top surface of the black matrix is substantially continuous with the surface of the first substrate, wherein the thin-film transistor comprises a gate electrode that is formed of a first metal layer formed on the top surface of the light-shielding material of the black matrix such that the gate electrode is located on the surface of the first substrate and outside the channel, while the black matrix is received in the channel and located under the gate electrode.

2. The BOA liquid crystal panel as claimed in claim 1, wherein the first substrate and the second substrate are glass substrates.

3. The BOA liquid crystal panel as claimed in claim 1, wherein the first substrate is a thin-film transistor (TFT) substrate and the second substrate is a color filter (CF) substrate.

4. The BOA liquid crystal panel as claimed in claim 1, wherein the thin-film transistor further comprises a gate insulation layer arranged on the first metal layer and covering the first substrate, a semiconductor layer arranged on the gate insulation layer, a second metal layer arranged on the semiconductor layer, and an insulation protection layer arranged on the second metal layer and covering the first substrate.

5. The BOA liquid crystal panel as claimed in claim 4, wherein the gate insulation layer comprises a material of silicon nitride.

6. The BOA liquid crystal panel as claimed in claim 4, wherein the semiconductor layer comprises a material of poly-silicon or amorphous silicon.

7. A manufacturing method of a black-matrix-on-array (BOA) liquid crystal panel, comprising the following steps:
   (1) providing a first substrate and a second substrate and washing the first substrate and the second substrate;
   (2) forming a channel in the first substrate;
   (3) forming a black matrix in the channel;
   (4) forming a thin-film transistor on the black matrix;
   (5) forming a color resist layer on the second substrate, forming a common electrode layer on the color resist layer and the second substrate, and forming a photoresist spacer on the common electrode layer; and
   (6) filling liquid crystal molecules between the first substrate and the second substrate to form a liquid crystal layer and packaging the first substrate and the second substrate;
   wherein the black matrix is formed of a light-shielding material filled in the channel such that a top surface of the light-shielding material is substantially flush with and continuous with a surface of the first substrate and wherein the thin-film transistor comprises a gate electrode that is formed of a first metal layer formed on the top surface of the light-shielding material of the black matrix such that the gate electrode is located on the surface of the first substrate and outside the channel, while the black matrix is received in the channel and located under the gate electrode.

8. The manufacturing method of the BOA liquid crystal panel as claimed in claim 7, wherein in step (1), the first substrate and the second substrate are glass substrates.

9. The manufacturing method of the BOA liquid crystal panel as claimed in claim 7, wherein in step (2), the channel is formed in the first substrate through photolithography or etching.

10. The manufacturing method of the BOA liquid crystal panel as claimed in claim 7, wherein step (4) comprises steps of sequentially forming the first metal layer, a gate insulation layer, a semiconductor layer, a second metal layer, and an insulation protection layer on the surface of the first substrate.

11. A manufacturing method of a black-matrix-on-array (BOA) liquid crystal panel, comprising the following steps:
   (1) providing a first substrate and a second substrate and washing the first substrate and the second substrate;
   (2) forming a channel in the first substrate;
   (3) forming a black matrix in the channel;
   (4) forming a thin-film transistor on the black matrix;
   (5) forming a color resist layer on the second substrate, forming a common electrode layer on the color resist layer and the second substrate, and forming a photoresist spacer on the common electrode layer; and
   (6) filling liquid crystal molecules between the first substrate and the second substrate to form a liquid crystal layer and packaging the first substrate and the second substrate;
   wherein the black matrix is formed of a light-shielding material filled in the channel such that a top surface of the light-shielding material is substantially flush with and continuous with a surface of the first substrate and wherein the thin-film transistor comprises a gate electrode that is formed of a first metal layer formed on the top surface of the light-shielding material of the black matrix such that the gate electrode is located on the surface of the first substrate and outside the channel, while the black matrix is received in the channel and located under the gate electrode;
   wherein in step (2), the channel is formed in the first substrate through photolithography or etching; and
   wherein step (4) comprises steps of sequentially forming the first metal layer, a gate insulation layer, a semiconductor layer, a second metal layer, and an insulation protection layer on the surface of the first substrate.

12. The manufacturing method of the BOA liquid crystal panel as claimed in claim 11, wherein in step (1), the first substrate and the second substrate are glass substrates.

* * * * *